United States Patent [19]

Mayston

[11] 4,380,946
[45] Apr. 26, 1983

[54] FILM PUNCH REGISTRATION

[75] Inventor: Donald Mayston, St. Albans, England

[73] Assignee: Protocol Engineering Limited, St. Albans, England

[21] Appl. No.: 178,736

[22] Filed: Aug. 18, 1980

[30] Foreign Application Priority Data

Aug. 24, 1979 [GB] United Kingdom ............... 7929647
Jul. 4, 1980 [GB] United Kingdom ............... 8021991

[51] Int. Cl.$^3$ ........................................... B26D 7/01
[52] U.S. Cl. ................................ 83/521; 83/467 A; 83/563; 83/628; 83/633; 353/26 R
[58] Field of Search .................. 83/375, 451, 467 A, 83/520, 521, 563, 602, 628, 633, 701; 33/184.5; 353/26 R; 308/3 A, 5 R, DIG. 1

[56] References Cited

U.S. PATENT DOCUMENTS

| 290,433 | 12/1883 | Jordan | 83/633 |
| 1,012,805 | 12/1911 | Bryen | 83/467 A |
| 2,415,539 | 2/1947 | Segal | 83/628 X |
| 3,290,975 | 12/1966 | Caesar | 83/628 X |
| 3,368,439 | 2/1968 | Bungay | 83/521 X |
| 3,744,858 | 7/1973 | Weichsel | 308/5 R |
| 3,763,730 | 10/1973 | Ahlegian | 83/521 |
| 3,809,468 | 5/1974 | Moritz | 353/26 A |

FOREIGN PATENT DOCUMENTS

| 2516210 | 11/1975 | Fed. Rep. of Germany . | |
| 2725130 | 12/1978 | Fed. Rep. of Germany | 83/521 |
| 1472090 | 3/1967 | France . | |
| 493804 | 10/1938 | United Kingdom . | |
| 645006 | 10/1950 | United Kingdom . | |
| 1128207 | 9/1968 | United Kingdom . | |
| 1228750 | 4/1971 | United Kingdom . | |
| 1383901 | 2/1975 | United Kingdom . | |
| 1390442 | 4/1975 | United Kingdom . | |
| 1443418 | 7/1976 | United Kingdom . | |
| 554782 | 11/1979 | U.S.S.R. | 83/520 |

Primary Examiner—James L. Jones, Jr.
Assistant Examiner—Robert P. Olszewski
Attorney, Agent, or Firm—Brisebois & Kruger

[57] ABSTRACT

In a method of and apparatus for punching a set of exposed films to obtain punch registration, two magnified images of respective areas of film are projected onto respective screens of two independently movable projection units so that either the magnified images of portions of image areas of two superimposed films can be brought into alignment on the screens or register markings on, or portions of the image areas of, each film in succession can be brought into alignment with respective markers on or adjacent the screens.

14 Claims, 18 Drawing Figures

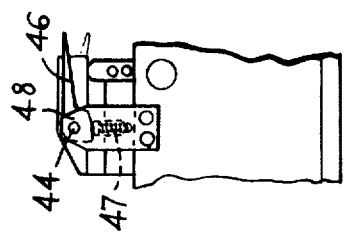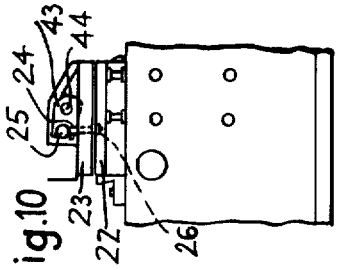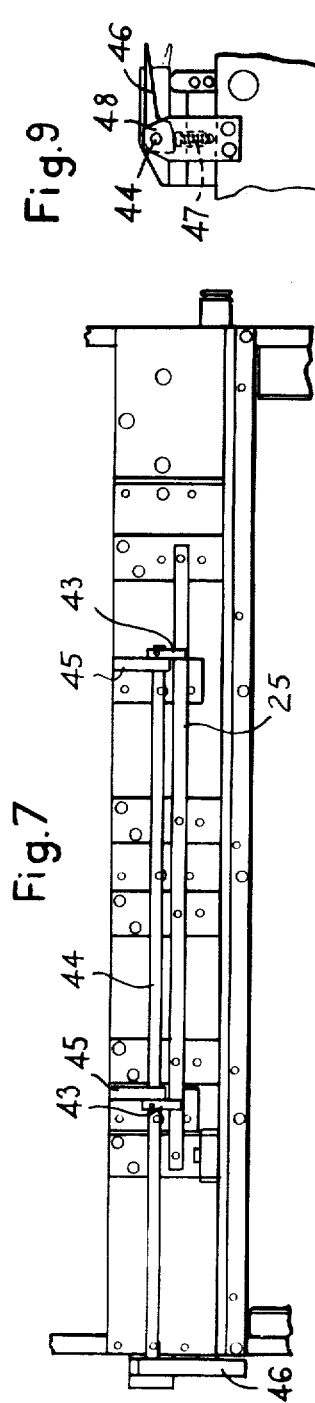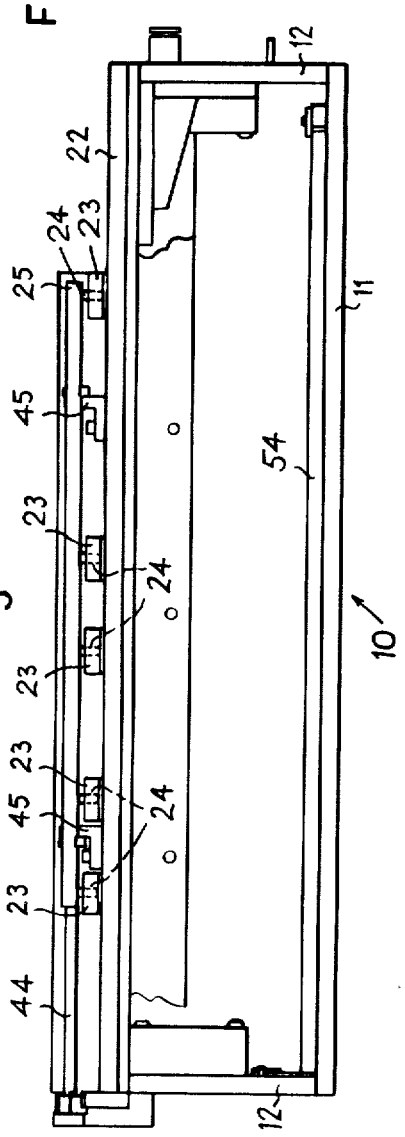

FILM PUNCH REGISTRATION

BACKGROUND OF THE INVENTION

1. Field of the Invention

This invention relates to film punches, particularly for providing multiple films such as color separations with punch register after exposure.

2. Description of the Prior Art

One type of film punch manufactured by the applicants, has an illuminated platform capable of accepting a maximum film size of 60×50 cm and punching heads which are inverted for operation from below upwards. A key film, usually that representing the blue separation or that with the most detail, is selected and placed on the platform over the punching heads, which are operated to perforate the film. The punching heads are brought to a position in which the punches project into, and are retained within the thickness of the key film to provide a positive location. Then the next separation is placed over the key film, slid over the punching heads, registered visually to the key film and the punching heads are operated to perforate the second film. The second separation is removed and the same procedure is repeated for the remaining color separations, after which the key film is released by depressing the punching heads to their original position.

Colour separations have, for some time, been produced on electronic scanners. Early electronic scanners were mostly single-channel and produced color separations one color at a time, so that color sets could be produced in register much the same as on a camera, by fitting the film drum with register pins. This enabled four separate pieces of film to be punched and placed in turn on the pins on the drum.

However, multi-channel scanners are now in operation. A four-channel scanner has the original film transparency fitted to one drum and the four-color separations are produced on a single piece of film, as shown in FIG. 1, of the accompanying drawings. One multi-channel scanner can produce register lines on the film that are in register with each separation. Further, if register crosses are included with the original transparency, for example by adhering the crosses thereto, then after the scanning operation they will appear against each separation.

Attempts have been made to produce a film punch that in addition to punching holes 1, 2, 3 and 4 adjacent illustrations A and B, will punch holes 5, 6, 7 and 8 in the correct relationship to illustrations C and D. However, due to the very close tolerances required, plus the movement of the film due to the temperature and humidity changes, this approach has not been successful.

The only practical method at the present time which is known to the applicants is to cut the film into four pieces and use the film punch previously described to introduce a pair of holes for each illustration using one of them as a key. However, such a method still relies upon operators having acute vision, who must maintain that vision throughout the entire working day for accurate punch registration.

SUMMARY OF THE INVENTION

Accordingly, it is the main object of the present invention to facilitate punching of four such films so as to obtain consistent punch registration accuracy.

To this end, the present invention consists in a punch for punching exposed films, in particular color separations, characterized in that provision is made for projecting two magnified images of respective areas of film onto respective screens.

By so projecting the film areas, the operator can see two datum positions at once, operator fatigue is reduced, greater accuracy is achieved due to greater enlargement, and speed is increased since one area of the film can be held whilst the second area of film is aligned.

The magnified images may be of register markings, on a first film, which markings can then be aligned with similar markings in the region of (on or adjacent) the screens after which the first film is punched and removed and second, third and fourth films with identically located register markings are successively placed in the punch and similarly aligned, and punched, or, the magnified images may be of portions of the image area in which case a second film is superimposed over a first film held in the punch and aligned image to image, and leaving the first film in position, third and fourth films are successively aligned image to image with the first film and then punched. Thus the film areas may be constituted by register markings or by portions of the image area. Both methods avoid difficulties of registration due to parallax which arises when a hand-held microscope is used to obtain alignment of the images.

In apparatus constructed in accordance with the present invention the method of aligning image to image is preferred although the apparatus may optionally have the facility of aligning register markings or images with markings in the region of the screens.

In a preferred embodiment of the present invention, the two screens are carried by respective projection units which are independently movable by the operator over a support surface for the films and which can be independently stopped and held in turn in an in register position. In such an embodiment, the projection units may be moved on a cushion of air and when stopped be instantaneously held in the respective in register position by means of a vacuum or by electrical or magnetic means thereby minimizing any possibility of either or both of the projection units being moved inadvertently out of their in register positions prior to punching of the film.

The invention also consists in a method of punching a plurality of exposed films, in particular color separations, said method being characterized by projecting two magnified images of respective areas of film onto respective screens.

BRIEF DESCRIPTION OF THE DRAWINGS

In order that the invention may be more readily understood reference will now be made to the accompanying drawings, in which:

FIGS. 7 and 8 are part end and plan views respectively of a frame and backstop assembly of the film punch, FIGS. 9 and 10 are scrap views of the frame and backstop assembly of FIGS. 7 and 8, FIGS. 11 and 12 are plan and side views respectively of a part of one projection unit of the film punch showing the control means and mirror assembly, FIG. 17 is a scrap view of a modification of each projection unit.

DESCRIPTION OF THE PREFERRED EMBODIMENTS

Figure 3:
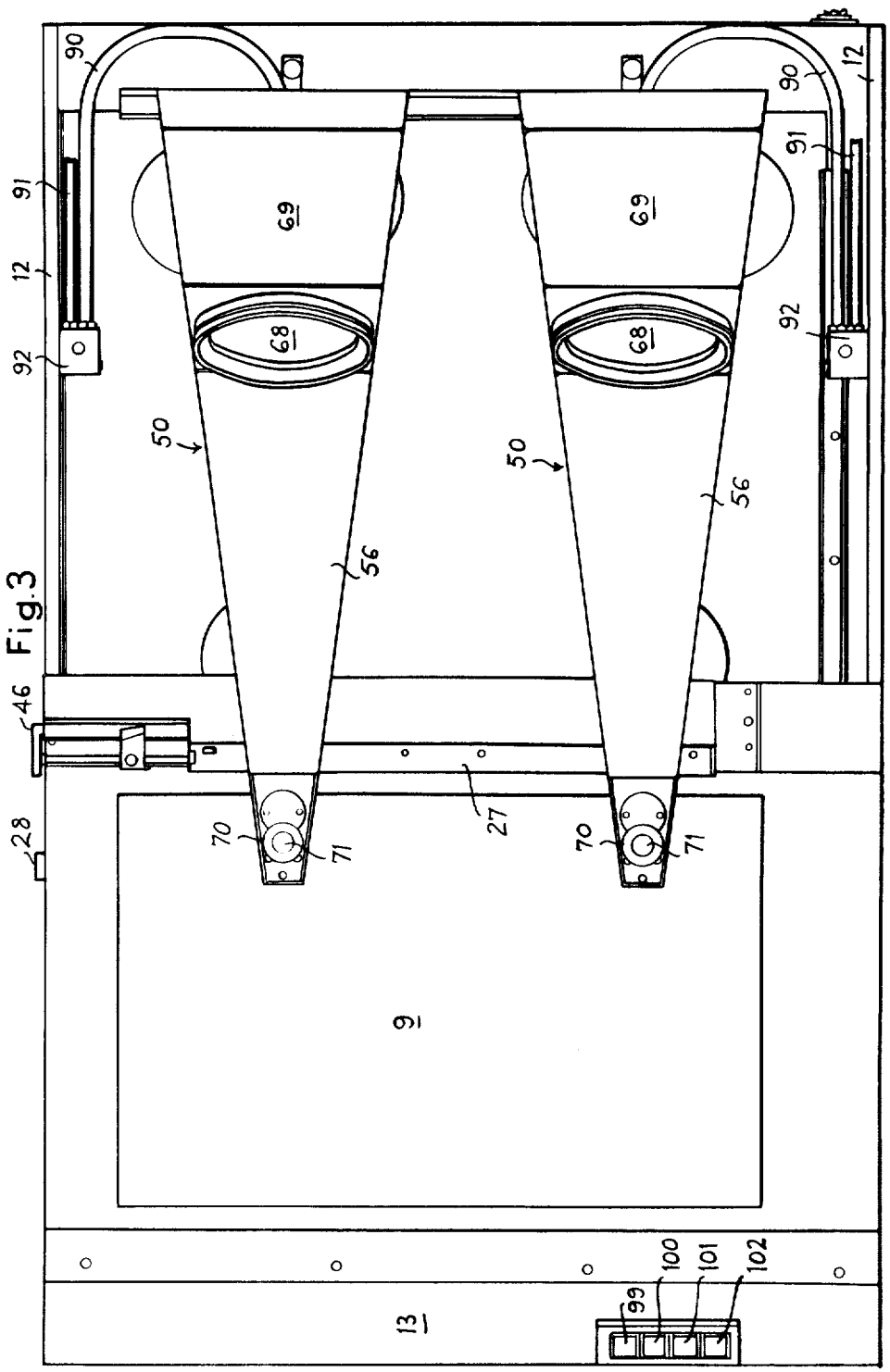
FIG. 3 is a plan view of the film punch of FIG. 1.
Figure 4:
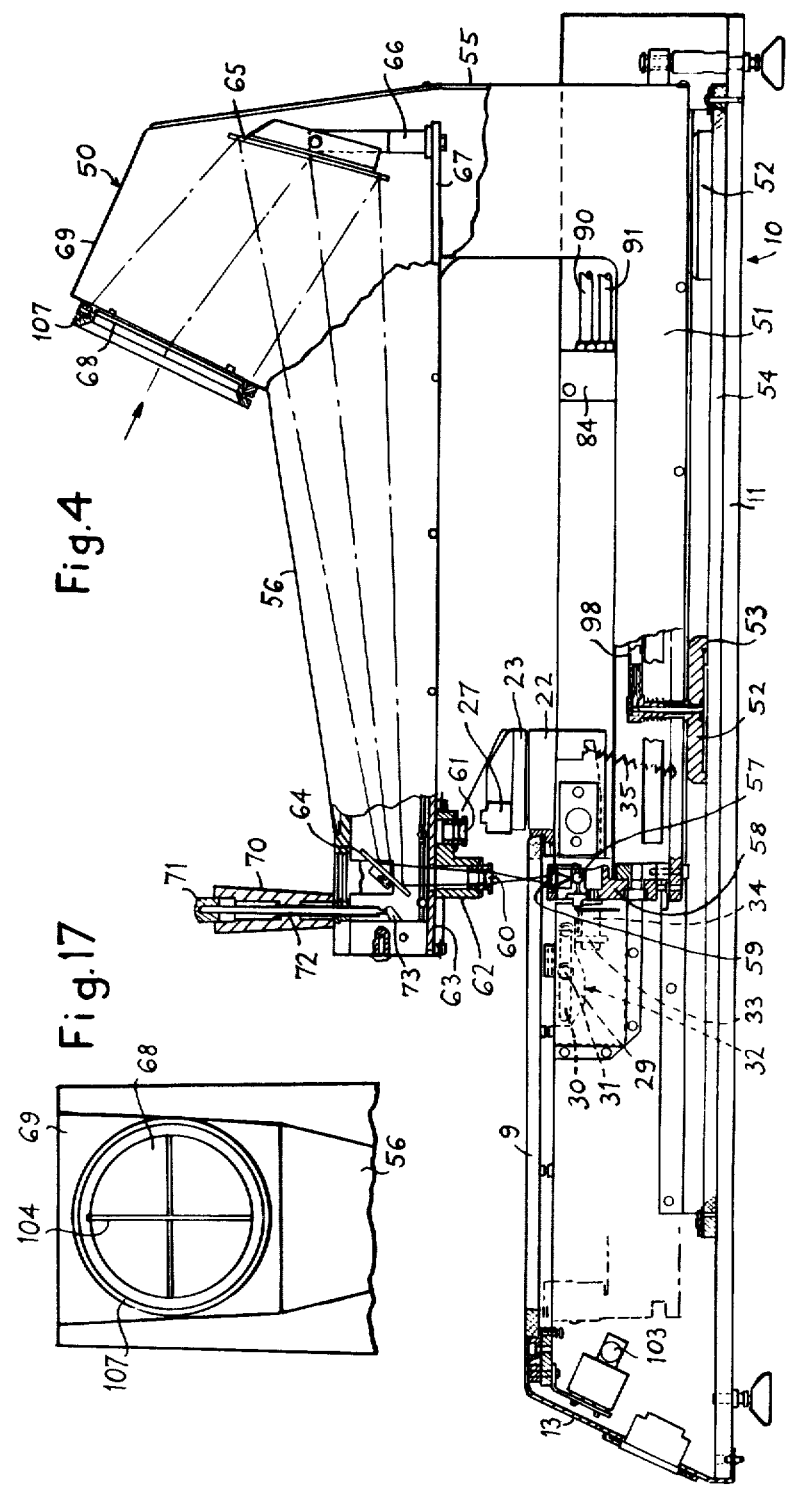
FIG. 4 is a part-sectional side elevation of the film punch.
Figure 5:
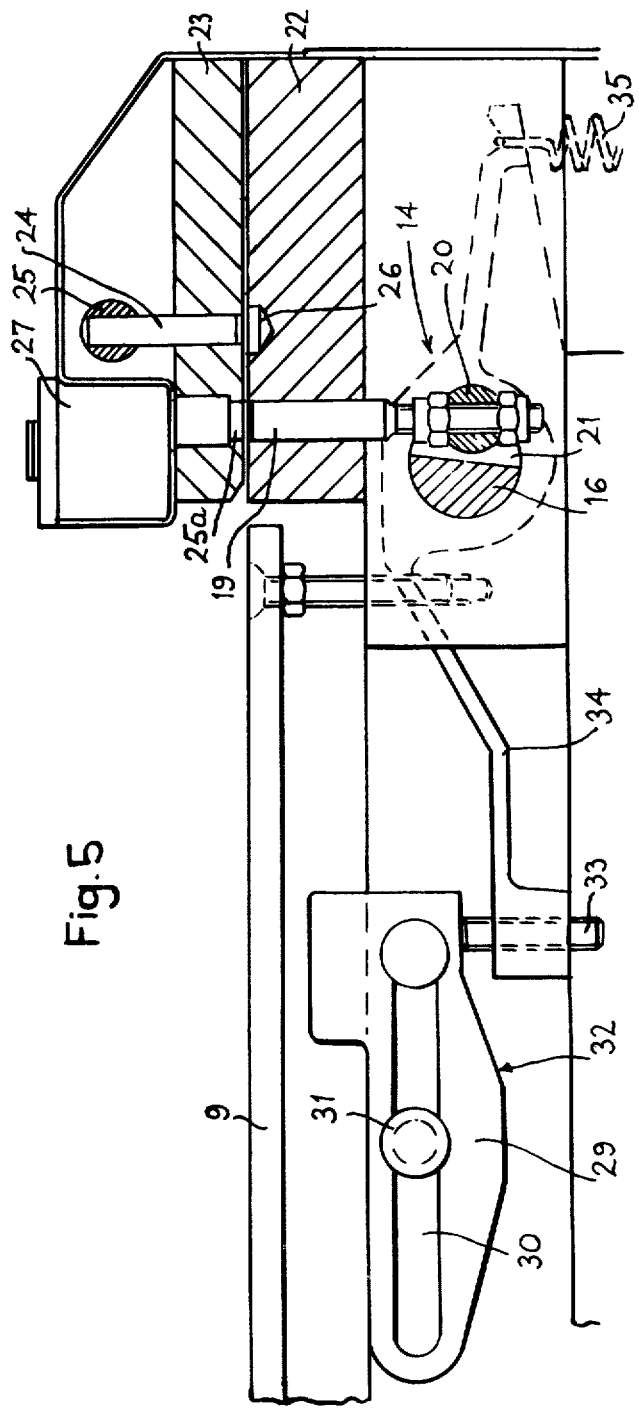
FIG. 5 is a scrap view, partly in section, showing one of five punching heads and parts of the punch operating mechanism of the film punch.

Referring to FIGS. 2 to 10, of the drawings, the film punch comprises a frame 10 having a base member 11, side members 12 and a front panel 13, supporting a fixed platform 9 of transparent material, e.g. of glass, and a punching mechanism comprising five inverted punching heads of which one punching head 14 is shown in FIG. 5. The punching heads are electrically, mechanically or pneumatically operated by means of a foot pedal 15 which permits the operator to have both hands free for registration. In the illustrated embodiment, the punching heads are mechanically operated, to which end the punching heads are connected to a shaft 16 which is rotated when the foot pedal 15 is depressed by means of a Bowden cable 17 and a lever system which is generally indicated at 18 in FIG. 6.

As will be most clearly apparent from FIG. 5, each punching head 14 comprises a punch 19 fixed to a pivot member 20 which fits in a respective eccentric recess 21 machined in the shaft 16. Each pivot member 20 is held in its respective recess by means of two pins (not shown) which project from opposite ends of the pivot member and engage in two axial grooves (not shown) respectively extending from opposite ends of the particular recess 21. When the shaft 16 is moved in an anticlockwise direction as viewed in FIG. 5 the punching heads will be moved and each punch 19 will lift inside a stripper plate 22 and into a respective die block 23 to perforate film (not shown) supported on the surface of the platform 9 and projecting into the gap between the stripper plate and die block with its top edge abutting against backstop pins 24 which are fixed to a bar 25 and which during punching are engaged in holes 26 in the stripper plate. A receptacle 27 is mounted on the die block 23, in communication with the punch aperture 25a therein, to receive stacks of chips punched from the films.

After punching, the punching heads 14 are moved to an intermediate position, in which the punches 19 are retained within the thickness of the film to hold the film in position, by means of a lever 28 (FIG. 2) which is fixed to a slider 29 having a guide slot 30 engaging with a guide pin 31. The slider 29 has a profiled undersurface 32 forming a cam engaged by a pin 33 fixed to a lever 34 which is in turn fixed to the shaft 16, the pin 33 being biassed into engagement with the cam surface 32 by a spring 35. In the position occupied by the slider 29 illustrated in FIG. 5, the pin 33 engages with the higher level of the cam surface 32 and is position for a punching operation. When the slider is moved to the right, as viewed in FIG. 5, by the lever 28, the pin rides downwardly and into engagement with the lower level of the cam surface, causing the shaft 16 to turn in an anticlockwise direction from its initial rest position to bring the punches into their intermediate position.

Figure 6:
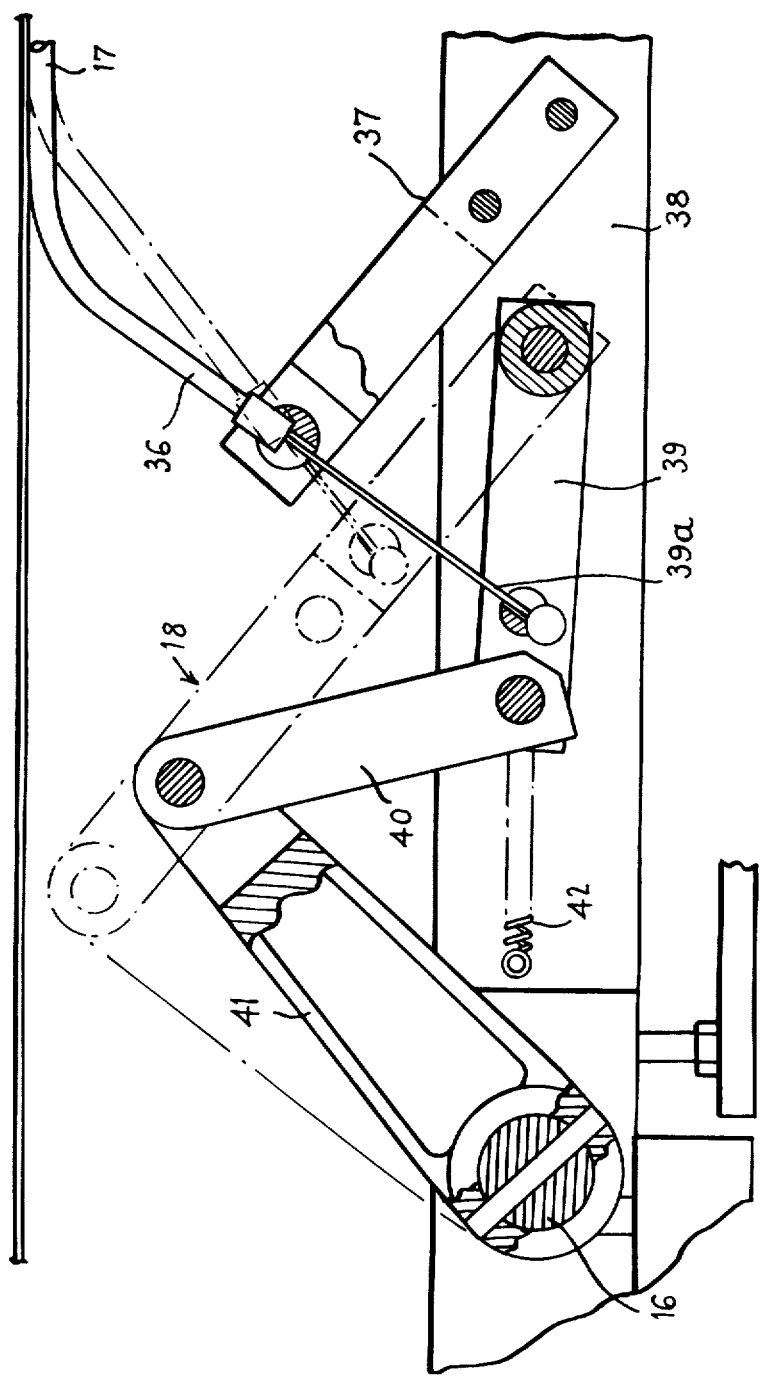
FIG. 6 is a scrap view of a part of the punch operating mechanism.

Referring now to FIG. 6, the end of sheath 36 of the Bowden cable 17 is secured to an arm 37 fixed to a support 38, and the cable 39a is fixed intermediate the ends of a lever 39, which is pivoted at one of its ends to the support 38 and at its other end to one end of a lever 40. The other end of the lever 40 is pivoted to one end of a lever 41 which at its other end is fixed to the shaft 16. The lever system 17 is biassed into the illustrated full-line position by a tension spring 42 connected between the support 38 and lever 39. Operation of the foot pedal 15 causes the lever system 17 to move into the chain line position illustrated and effect anticlockwise rotation of the shaft 16 to operate the punching heads 14, the springs 42, 35 returning the shaft 16, lever system 17 and foot pedal 15 to their rest positions when the operator's foot is lifted from the pedal.

Referring more particularly to FIGS. 7 to 10, the stop pins 24 and bar 25 form part of a two-position back stop, of which the bar 25 is lowered and raised by means of forked levers 43 fixed to an operating shaft 44 rotatably supported on brackets 45 mounted on the upper surface of the stripper plate 22. The shaft 44 is rotated by means of a lever 46 which is held in either of two positions by means of a compression spring 47 which cooperates with respective flats on a boss 48 fixed to the lever 46. Thus by operating the lever 46, the stop pins 24 are moved between a raised position in which they occupy the position shown, and a lowered position in which they project across the gaps between the die blocks and stripper plate 22 and into the holes 26, where the pins 24 form a backstop for the top edges of the films inserted into the said gaps.

Figure 1:
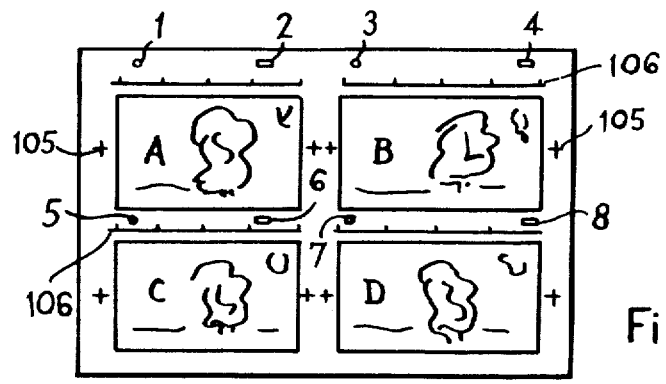
FIG. 1 is a diagrammatic representation of a sheet of film which bears four color illustrations and which has been previously referred to herein.

In order to register the films, e.g. four color separations cut from the film shown in FIG. 1, by means of the image, the film punch is provided with means for projecting two magnified images of portions of the image area onto respective screens, comprising two independently movable projection units 50, as will be apparent from FIGS. 2, 3 and 4 to which reference will now be made. Each projection unit 50 is of generally U-shaped configuration, with the U being on one side and with one arm of the U forming a base supporting member 51 which projects through an opening at the rear of the base frame and underneath the glass platform 9. The base supporting member 51 has a plurality of saucer members 52 (three in the embodiment illustrated) for a purpose to be described, which through their machined flat outer rims 53, normally rest against a glass sheet 54 extending over, and supported by the base frame member 11. The base of the U is formed by an upright 55 which supports the other arm of the U which is constituted by a control and projection housing 56. The housing 56 projects over the upper surface of the glass platform 9.

Supported from the base member 51 of each projection unit 50, beneath the transparent platform 9, are a lamp 57 in a lamp housing mounted on a supporting bracket 58 upstanding from and secured to the base member 51, and a condenser lens 59 aligned with an aperture in and supported from the lamp housing. Above the transparent platform 9, the housing 56 carries two adjustable objective lenses 60 and 61, e.g. of ×15 and ×27 magnification respectively. The lenses 60 and 61 are mounted in a common holder 62 which is movable in a slideway 63 on the under surface of the housing 56 so that either of the lenses 60 and 61 can be aligned as desired with the condenser lens 59. Within the housing 56 are disposed a 45° plain mirror 64 above the lens 60, as shown, and an inclined mirror 65 which is mounted on a support 66 secured to the base plate 67 of the housing 56. An inclined translucent screen 68 is mounted in a cowling part 69 of the housing 56 and above the housing so as to be readily visible by an operator. The optical arrangement of each projection unit 50 is such that, the light rays from lamp 59 travel along the path indicated by the chain lines in FIG. 4. The light rays pass through the lens 59, pass through either of lenses 60 and 61 onto the mirror 64 which reflects the light rays inside the housing 56 onto the mirror 65 which in turn reflects the light rays onto the back of the screen 68. Thus when a film is placed on the platform 9, a magnified image of a portion of the image area of the film can be viewed by an operator on the screen from the front of the punch.

Each projection unit 50 is independently movable by means of an operating handle 70 carrying a push button 71 which, when pressed, causes compressed air to be fed from a vacuum pump (not shown) to the saucer members 52 so that the unit 50 floats on a bed of compressed air produced between the bottom of the member 51 and the glass sheet 54. Thus, by holding the handle 70 with the push button 71 depressed, each projection unit 25 can be very easily moved with respect to and in any required direction within a defined working area over, the platform 9. It will be appreciated that the action of depressing the push button 71 connects the saucer members 52 to the pressure side of the pump circuit which also has a vacuum side for a purpose to be explained. The pump preferably is situated at a location which is remote from the punch so as to avoid any possible vibration which may interfere with registration of the images. However, if insulated by suitable vibration damping means, the pump may be mounted on the frame 10 (FIG. 6). When the push button 71 is released, the saucer members 52 are connected to the vacuum side of the pump circuit which, immediately, clamps the saucer members to the glass sheet 54, firmly holding the projection unit at the desired position without the need for any further action having to be undertaken by the operator. The machined rims 53 on the saucer members 52 guard against the possibility of dust and dirt entering into the saucer depressions.

Figure 11:
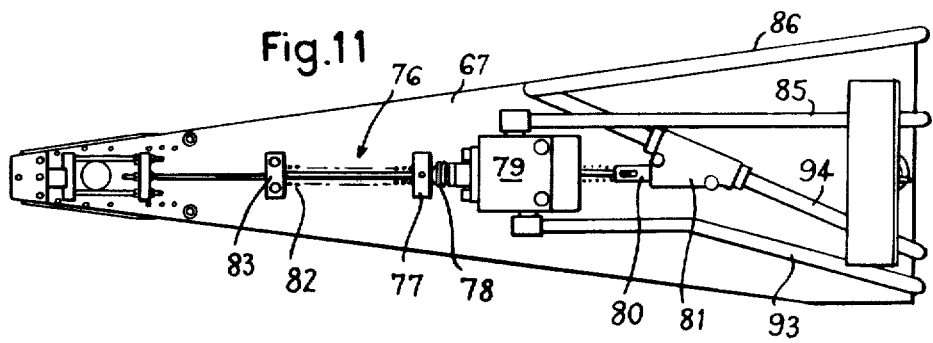
Figure 12:
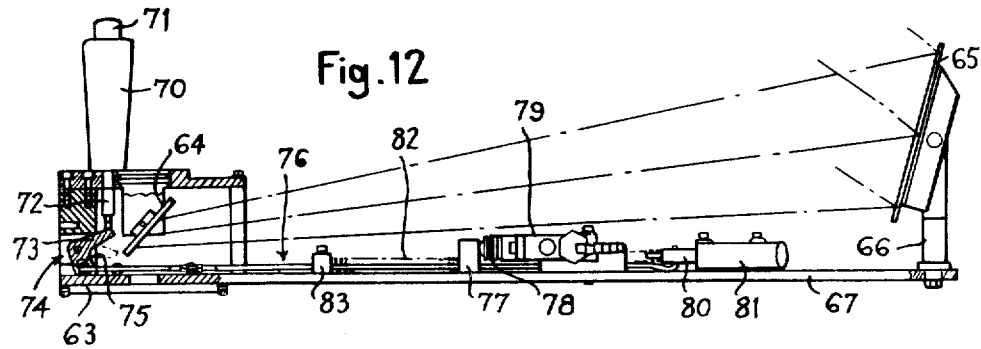
Figure 13:
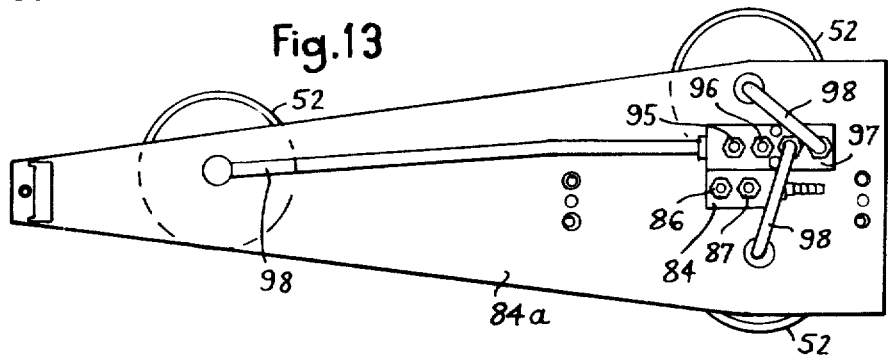
FIGS. 13 and 14 are plan and side views respectively of a base part of one of the projection units.
Figure 14:
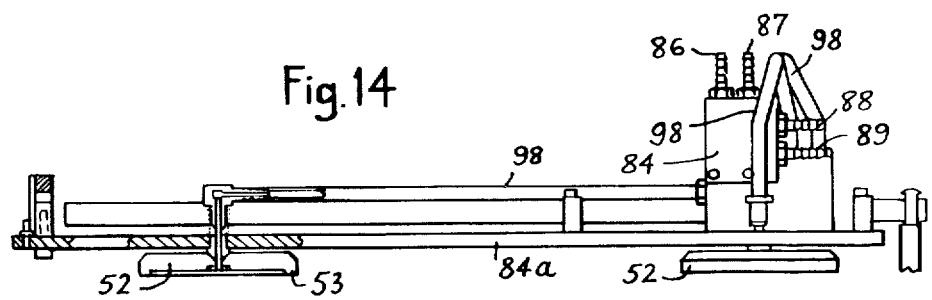

Referring more particularly to FIGS. 4, 11 and 12, the push button 71 is fixed to a push rod 72 passing through the hollow interior of the handle 70 and engaging with one arm 73 of a two-armed pivoting lever 74, whose other arm 75 is bifrucated and engages with one end of a linkage which is generally indicated at 76 and is mounted within the housing 56 on the base plate 67. An actuating block 77 is fixed to the linkage 76 intermediate its ends and engages with an actuating member 78 of a vacuum valve 79. At its other end, the linkage 76 is connected to the plunger 80 of a pressure valve 81. The push button 71 is biassed into the position illustrated in FIGS. 4 and 12 in which the vacuum valve 79 is open by means of a compression spring 82 acting between the actuating block 77 and an abutment 83 fixed to the base plate 67.

The valves 79 and 81 are connected respectively to the vacuum and pressure sides of the pumping circuit. This is achieved by connecting the valves 79 and 81 to a manifold 84, fixed to a base plate 84a of the base member 51 of the projection unit 50, by conduits 85 and 86 which engage with connectors 86 and 87 respectively, the manifold 84 having connectors 88 and 89 for conduits 90 and 91 (FIGS. 3 and 4) which are connected to a manifold 92 (FIG. 3) supported on a side panel 12 of the frame 10. As will be appreciated from FIG. 3 there is a manifold 92 for each projection unit and each manifold 92 is connected by two conduits (not shown) to the pressure and vacuum sides of the pump. To complete the circuit, the valves 79 and 81 are connected to the saucer members 52 by means of conduits 93 and 94 to respective connectors 95, 96 of a second manifold block 97 fixed to the base plate 84a and three conduits 98 connected between the manifold block 97 and the depressions of the saucer members 52. The conduits 85, 86, 90, 91 and 93, 94 are slack and of a flexible material such as plastics so as not to prevent movement of the projection unit 50.

As shown in FIG. 3, the front panel 13 has mounted thereon a mains indicating light 99 and three push-button operated switches 100, 101 and 102, the switch 100 being an electricity on/off switch which also operates the light 99, the switch 101 being for operating the various optical lamps such as the lamp 57 and a lamp such as a fluorescent tube 103 (FIG. 4) for illuminating the glass platform 9, and the switch 102 being for operating the vacuum pump.

To produce punch register of a set of films, produced for example by cutting the single piece of film shown in FIG. 1 on which four color illustrations have been produced previously by means of a four channel electronic scanner, into four color separations to form a color set, the procedure is as follows:

The lever 46 is moved to bring the backstop pins 24 into their lower positions, the foot pedal 15 is depressed and the lever 28 is moved away from the punching heads 14 (towards the operator). One of the films is then positioned over the punching heads with its top edge abutting against the stop pins 24. The punching heads 14 are then operated by depressing the foot pedal 15 to perforate the film and then the lever 28 is moved in the direction of the punching heads to ensure that the film is retained on the punches 19. The lever 46 is then moved to raise the stop pins 24.

The lens 60 or 61 having the magnification appropriate to the particular image is then selected and each unit 50 is positioned in turn over the film by holding the pistol grip handle 70 and depressing the push putton 71 until the cushion of air allows the particular projection unit to float and appropriate portions of the image area of the film are projected onto the respective screens 68. When the push button 71 of each projection unit 50 is released, the air in each cushion is bled off, instantaneously clamping the particular projection unit to the glass sheet 54 by means of the vacuum to hold the projection unit in position. A second film is then placed on top of the first film and aligned until both the images are in register on the screens 68. The second film is then punched and the same sequence is repeated for the remainder of the set of four films.

Figure 18:
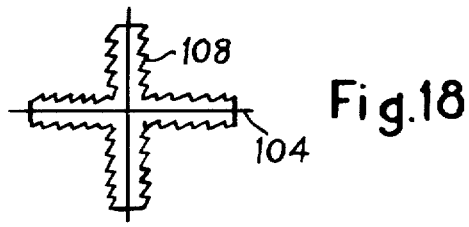
FIG. 18 shows one form of magnified image of a register marking.

FIG. 17 shows a modification in which a cross-line 104 is provided on each screen 68 to provide an alternative method of registration. The position of each projection unit 50 is then adjusted over the film until the projected images, either of register crosses 105 or markings 106 (FIG. 1) provided by the scanner, or portions of the image area are superimposed over the cross-lines on the screens 68. If necessary, a screen bezel 107 may be rotated to obtain exact alignment. When both images are in register, the push buttons 71 are released to hold the projection units in position. The magnified projected image 108 of a register cross 105 may have a screened pattern as shown in FIG. 18 which also shows the cross-line 104 aligned in the centre of the image 108. The foot pedal 15 is then depressed, the lever 28 is moved towards the operator and the film removed. The next film is placed under the clamped projection units, its position adjusted until the register crosses or markings in the same positions as those of the first film or the same portions of the images are aligned on the screens with the cross-lines. When aligned, the foot pedal 15 is depressed to punch the film. This is repeated with the remaining films.

Whichever method used, a set of films is obtained which will have a identical pattern of punched holes and can be re-registered by inserting register pins into the two outer holes. Moreover, the foot pedal operation allows each film to be held with both hands whilst being punched.

Figure 2:
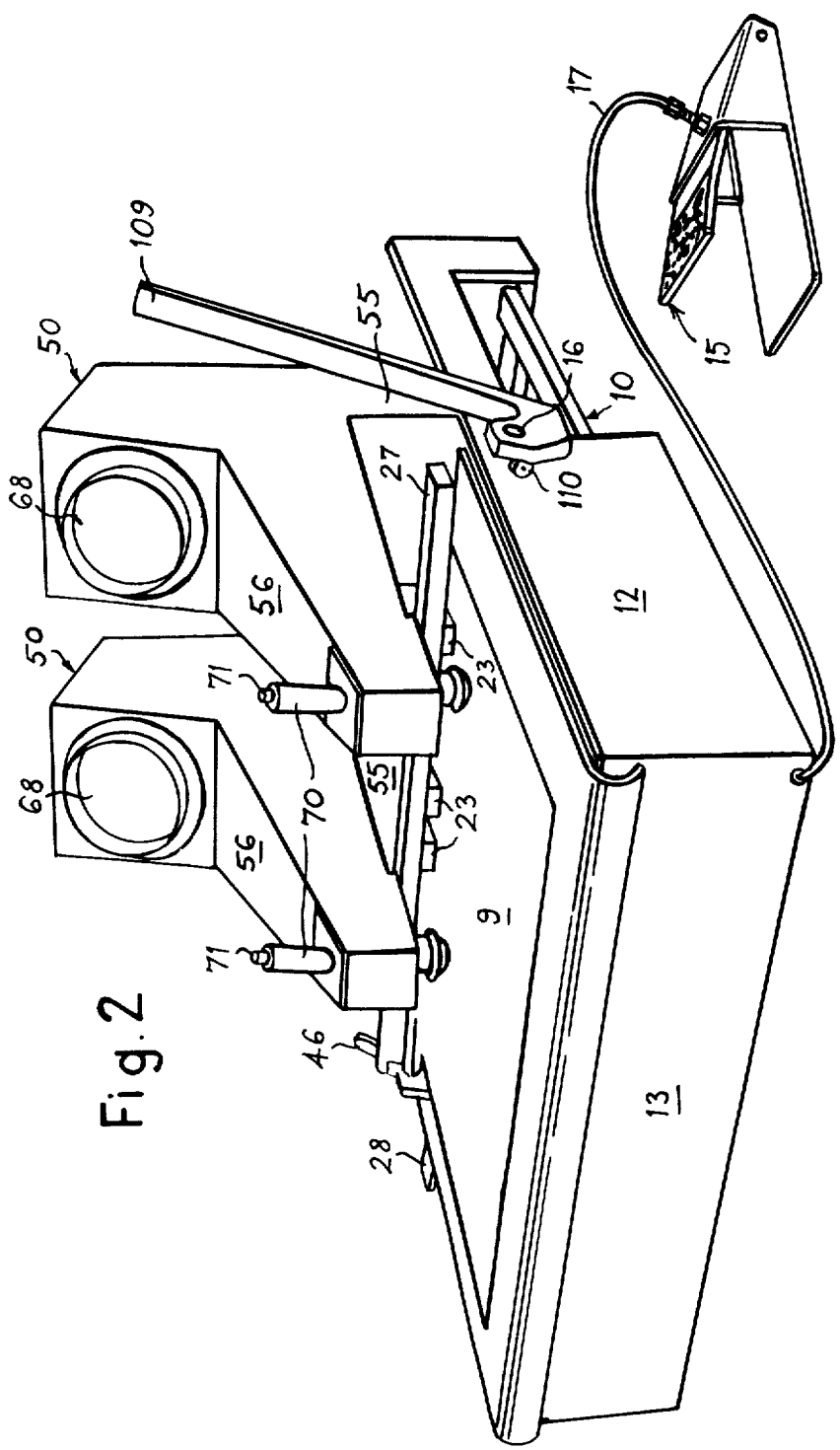
FIG. 2 is a perspective view of one embodiment of film punch, constructed in accordance with the invention.

As shown in FIG. 2, the punch also has a manual operating handle 109 which is generally used only as a standby and which is secured to the shaft 16 by means of a knurled thumb screw 110.

Figure 15:
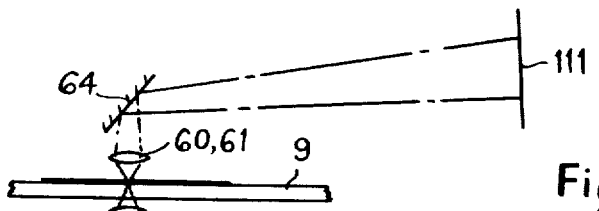
FIGS. 15 and 16 are optical path diagrams of alternative projection units.
Figure 16:
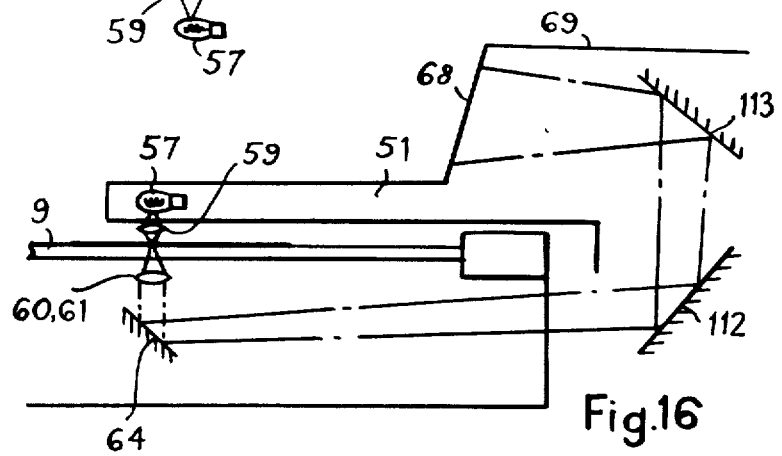

In the optical arrangement of FIG. 15 a reflective screen 111 is used instead of screen 68 and mirror 65, and in that of FIG. 16 the base member 51 carrying the lamp 57 and condenser lens 59 is positioned above, and the focussing lens 60, 61 and mirror 64 beneath, the platform 9. In FIG. 16, instead of the plane mirror 65, two plane mirrors 112 and 113 which are inclined in opposite directions are required to direct the magnified image onto the screen 68. It will be appreciated that, in a film punch using the optical arrangement of FIG. 16, the housing 56, save for the cowling part 69 mounting the screen 68 would be disposed beneath the platform 9 and would carry the saucer members 52 and associated manifolding and the base member 51 would mount the cowling part 69 and control means for the projection units.

The film punches described permit the registration of separate films originally produced on a single piece of film by means of a four-channel electronic scanner and there films to be punched easily, speedily and with great accuracy.

I claim:

1. Apparatus for punching a plurality of exposed films to obtain punch registration, said apparatus comprising a platform for supporting the films to be registered and punched, a plurality of punches for punching the films, two projection screens, optical means for magnifying two images of respective areas of film, means for projecting the two magnified images onto the two screens respectively, the screens, the optical means and the projection means for the two images respectively being carried by two projection units each of which is independently movable with respect to the platform, means for producing a cushion of air under each projection unit on which the latter can be moved and means for connecting each projection unit alternately to a source of air pressure to produce the cushion of air and a source of vacuum to hold the projection unit in an in-register position.

2. Apparatus as claimed in claim 1, characterized in that each projection unit has a respective handle for manually moving the projection unit, and a respective actuating member which is operable to connect the particular projection unit to the pressurized air source and releasable to connect the particular projection unit to the vacuum source.

3. Apparatus as claimed in claim 2, characterized in that each actuating member is a push button mounted on the associated handle, the push button cooperating with a push rod which co-operates with a linkage for operating pressure and vacuum valves connected respectively to the pressure and vacuum sources, each push button being biassed into its released position.

4. Apparatus as claimed in claim 3, characterized by means defining a plurality of depressions in the undersurface of each projection unit, said depressions being connected to said valves.

5. Apparatus as claimed in claim 4, characterized in that the valves are connected by means of slack, flexible conduits to the depressions and to respective manifolds which are connected to the pressure and vacuum sources and which are fixed with respect to the projection units.

6. Apparatus as claimed in claim 1, and further comprising a supporting frame, means fixing said platform to said frame, means mounting said punches to said frame for punching each film outside its useable image area and along an edge thereof and means for moving each projection unit independently in any required direction within a defined working area over said platform, said moving means including said means for producing said cushion of air.

7. Apparatus for punching a plurality of exposed films to obtain punch registration, said apparatus comprising a plurality of punches for punching the films, a transparent platform for supporting the films to be registered and punched, two projection screens, optical means for magnifying two images of respective areas of film, means for projecting the two magnified images onto said two screens respectively, the screens, the optical means and the projection means for the two images respectively being carried by two projection units, each of which is independently movable with respect to the platform and comprises two members which respectively project over and beneath the platform, one above the other, one of said members carrying a light source and part of said projection means and the other of said members carrying another part of said projection means, and said optical means and including a housing within which the other part of the projection means is disposed and either of said members carrying a respective one of said screens, means for producing a cushion of air under each projection unit on which the latter can be moved, and means for connecting each projection unit alternately to a source of air pressure to produce the cushion of air and a source of vacuum to hold the projection unit in an in-register position.

8. Apparatus as claimed in claim 7 characterized by two registration markers located in respective regions of said screens.

9. Apparatus as claimed in claim 8, characterized by means for turning the respective registration markers.

10. Apparatus as claimed in claim 7, characterized in that each projection unit has a respective handle for manually moving the projection unit, a respective actuating member which is operable to connect the particular projection unit to the pressurized air source and releasable to connect the particular projection unit to the vacuum source.

11. Apparatus as claimed in claim 10, characterized in that each actuating member is a push button mounted on the associated handle, the push button cooperating with a push rod which co-operates with a linkage for operating pressure and vacuum valves connected respectively to the pressure and vacuum source, each push button being biassed into its released position.

12. Apparatus as claimed in claim 11, characterized by means defining a plurality of depressions in the undersurface of each projection unit, said depressions being connected to said valves.

13. Apparatus as claimed in claim 12, characterized in that the valves are connected by means of slack, flexible conduits to the depressions and to respective manifolds which are connected to the pressure and vacuum sources and which are fixed with respect to the projection units.

14. Apparatus as claimed in claim 7, characterized by backstop means movable between a raised position and a lowered position in which it acts as a backstop for the top edge of a film, and characterized in that the punches are inverted and are operated by a foot pedal and in that means connect said foot pedal to a shaft connected to the punches, whereby operation of the foot pedal causes the shaft to turn and lift the punches, and means are provided for moving the punches into an intermediate lifted position in which the punches are retained within the thickness of a punched film.

* * * * *